(12) United States Patent
Ure

(10) Patent No.: US 11,829,203 B2
(45) Date of Patent: Nov. 28, 2023

(54) MOBILE ELECTRONIC DEVICE ENABLING SCREEN SIZE VARIATION

(71) Applicant: Michael J Ure, Holladay, UT (US)

(72) Inventor: Michael J Ure, Holladay, UT (US)

( * ) Notice: Subject to any disclaimer, the term of this patent is extended or adjusted under 35 U.S.C. 154(b) by 0 days.

(21) Appl. No.: 16/658,683

(22) Filed: Oct. 21, 2019

(65) Prior Publication Data

US 2020/0050318 A1 Feb. 13, 2020

Related U.S. Application Data

(63) Continuation of application No. 15/911,080, filed on Mar. 3, 2018, now abandoned.

(51) Int. Cl.
| | |
|---|---|
| *G06F 1/16* | (2006.01) |
| *H04M 1/04* | (2006.01) |
| *H05K 5/00* | (2006.01) |
| *H04M 1/02* | (2006.01) |
| *G06F 3/041* | (2006.01) |

(52) U.S. Cl.
CPC .......... *G06F 1/1652* (2013.01); *G06F 1/1681* (2013.01); *H04M 1/0216* (2013.01); *H04M 1/0268* (2013.01); *H04M 1/04* (2013.01); *H05K 5/0017* (2013.01); *G06F 1/1616* (2013.01); *G06F 1/1618* (2013.01); *G06F 1/1643* (2013.01); *G06F 3/0416* (2013.01)

(58) Field of Classification Search
CPC .... G06F 1/1616; G06F 1/1618; G06F 1/1652; G06F 1/1632; G06F 1/1681; H04M 1/0268; H04M 1/0216
See application file for complete search history.

(56) References Cited

U.S. PATENT DOCUMENTS

| | | | |
|---|---|---|---|
| 7,095,387 B2* | 8/2006 | Lee | G06F 3/147 |
| | | | 345/1.3 |
| 8,787,016 B2 | 7/2014 | Rothkopf et al. | |
| 9,173,287 B1* | 10/2015 | Kim | G06F 1/1652 |
| 9,710,021 B2* | 7/2017 | Kauhaniemi | G06F 1/1652 |
| 10,073,496 B2* | 9/2018 | Chen | E05D 7/00 |
| 11,503,728 B2* | 11/2022 | Sun | E05D 3/122 |
| 2010/0064564 A1* | 3/2010 | Bemelmans | G06F 1/1601 |
| | | | 40/607.01 |
| 2010/0164837 A1* | 7/2010 | Kao | G06F 1/1616 |
| | | | 345/1.3 |
| 2010/0232100 A1* | 9/2010 | Fukuma | H04M 1/0216 |
| | | | 361/679.01 |
| 2012/0307423 A1* | 12/2012 | Bohn | H04M 1/0216 |
| | | | 361/679.01 |
| 2013/0222998 A1* | 8/2013 | Cho | G06F 1/1601 |
| | | | 361/679.27 |
| 2015/0198978 A1* | 7/2015 | Catchpole | G06F 1/1632 |
| | | | 345/173 |
| 2017/0142847 A1* | 5/2017 | Park | G06F 1/1652 |
| 2018/0049336 A1* | 2/2018 | Manuel | E05D 11/1028 |
| 2019/0261524 A1* | 8/2019 | Choi | G06F 1/1616 |

* cited by examiner

*Primary Examiner* — Nidhi Thaker

(57) ABSTRACT

A mobile electronic device includes a flexible display having a front display surface and a back non-display surface; and a folding mechanism configured such that the display is folded with back non-display surfaces facing each other. The folding mechanism may include at least one rounded radius about which the display is folded, and may be configured such that the display is folded a plurality of times. The mobile electronic device may take the form of a display accessory including a docking mechanism for receiving a primary mobile electronic device.

1 Claim, 7 Drawing Sheets

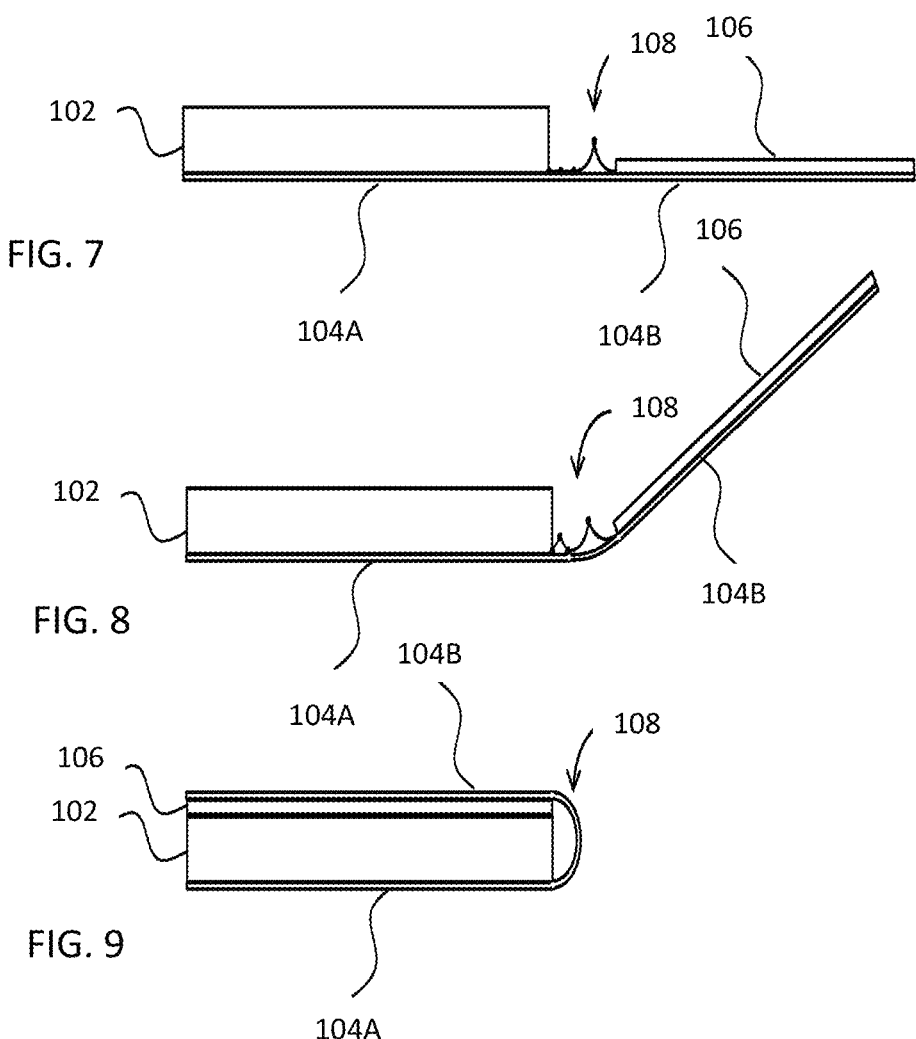

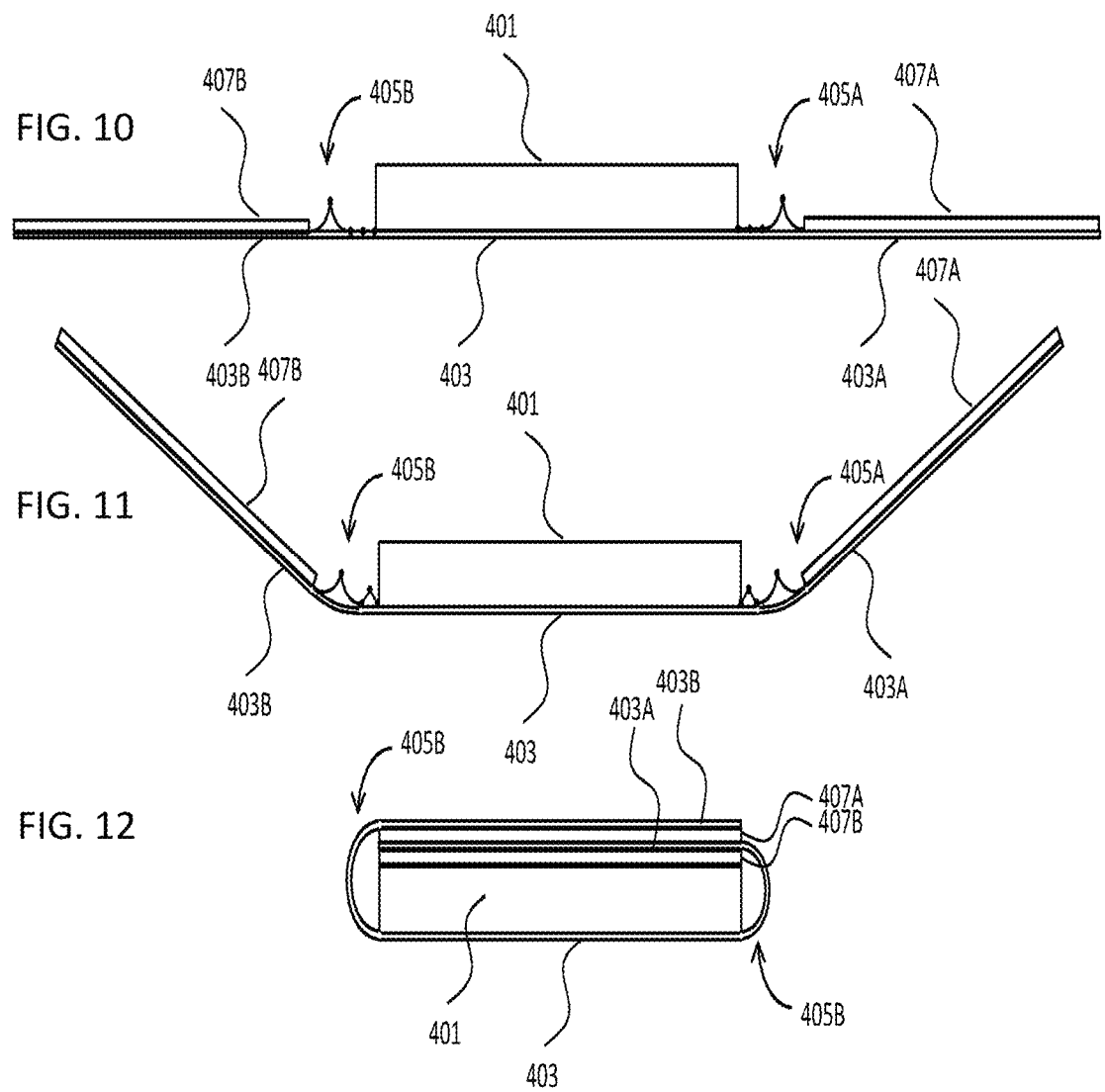

MOBILE ELECTRONIC DEVICE ENABLING SCREEN SIZE VARIATION

BACKGROUND

The desire for large displays has resulting in "phablets," smartphones with displays larger than the typical smartphone but smaller than a tablet. Phablets can be bulky and unwieldy at times. Moreover, the increased display size is often still insufficient.

SUMMARY

The present mobile electronic device provides for a device that is convenient to carry and that can be manipulated to provide a large display when desired. In one embodiment, a flexible display is arranged to be folded into three segments. In one embodiment, a middle segment is always visible. Right and left segments may be stowed (not visible) and unstowed (visible). With only the middle segment visible, the device functions as a phone. With all segments visible, the device functions as a tablet.

In one embodiment, a back having a double sliding action is provided. The flexible display is mounted on a backing having spring properties. Magnets are provided in strategic locations to secure the right and left segments of the display in a folded configuration. To unstow, the back is slid to one side, exposing on the backside of the device one of the folded over display segments, held in place by action of the magnets. This display segment is gripped and released so that it springs into plane with the middle segment The back is then slid to an opposite extreme, exposing the other folded segment, which is then released in similar manner. During stowing of the segments, these actions are reversed. The display may be continuous or may be formed of discrete display segments.

In some embodiments, the back may have two hinged portions that, in the stowed state, cover the bends of the display To unstow, the bend covers of the display are opened to allow the back to be slid from the extreme one side to the extreme other side. In other embodiments, two hinged backing members are provided alongside the main body of the device to support right and left display segments. The hinges are arranged such that when the backing members are folded back, the resulting display folds place minimal stress on the display. A back snap-on cover may optionally be provided for additional screen protection. The hinge members may be provided, for example, in gap areas between the housing edge and the display at the top and bottom of a typical smartphone. The hinges may be configured so as to cover edges of the display fold areas of the display when the backing members are folded back. These edges may be bare in order to achieve folding without undue stress on the display Usage guidelines may be determined to prevent any permanent deformation of the display in the area of the display folds. For example, the device may be opened with the display unfolded and flat overnight and during charging or other periods of non-use.

In some embodiments, the device is configured so that the right and left display segments fold in both directions, forward and backward. Effects of folding in one direction may be counteracted by folding in the opposite direction.

Capacity of a battery of the device may be scaled up from that of a typical smartphone in accordance with the increased display size. The display and the display driver may be provided with a mode in which only the middle segment is powered. In some embodiments, the backing members for the right and left display segments may be or include batteries. For example, a thin large area battery may be provided in three segments corresponding to the three segments of the display. The segments may be interconnected by traces formed on the display substrate, with connection to device electronics occurring at the middle segment.

In other embodiments, a mobile electronic device is provided with interchangeable display modules that may be interchanged without the use of tools. An electronics housing and the display module mate and snap together. A standard display module may be interchanged with a display module of the type described having a larger display area and hinged backing members.

In other embodiments, a mobile electronic device includes a flexible display having a front display surface and a back non-display surface; and a folding mechanism configured such that the display is folded with back non-display surfaces facing each other.

The folding mechanism may include at least one rounded radius about which the display is folded, and may be configured such that the display is folded a plurality of times.

The mobile electronic device may take the form of a display accessory including a docking mechanism for receiving a primary mobile electronic device.

BRIEF DESCRIPTION OF THE DRAWING FIGURES

The present invention may be further understood from the following detailed description in conjunction with the appended drawing figures. In the drawing:

FIG. 7 is a horizontal cross-section is shown of a mobile electronic device.

FIG. 8 is a view of a folding mechanism of the device of FIG. 1.

FIG. 9 is another view of the folding mechanism.

FIG. 10 is a horizontal cross-section is shown of a mobile electronic device.

FIG. 11 is a view of a folding mechanism of the device of FIG. 4.

FIG. 12 is another view of the folding mechanism.

DESCRIPTION

Figure 1:
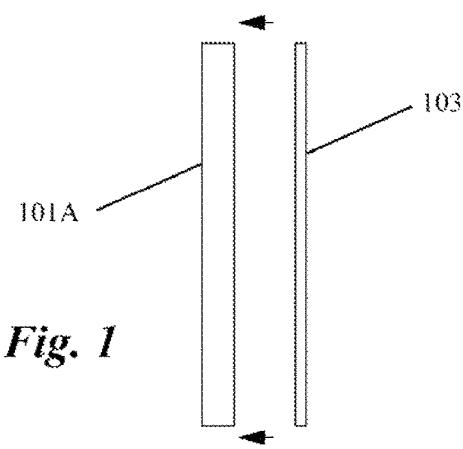
FIG. 1 is a side view of a mobile electronic device having an electronics housing and a display module.
Figure 2:
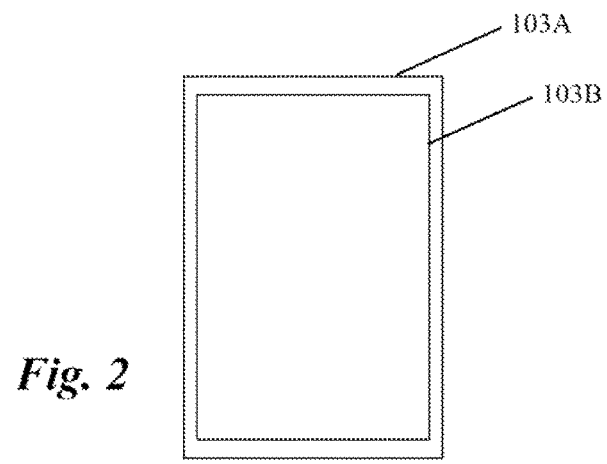
FIG. 2 is a front view of the mobile electronic device of FIG. 1.

Referring to FIG. 1, a diagram is shown of a mobile electronic device having a body 101A and a snap-on display module 103. The display module 103 may be interchanged with another display module. As seen in FIG. 2, one display module includes a bezel portion 103A and a display portion 103B.

Figure 3:
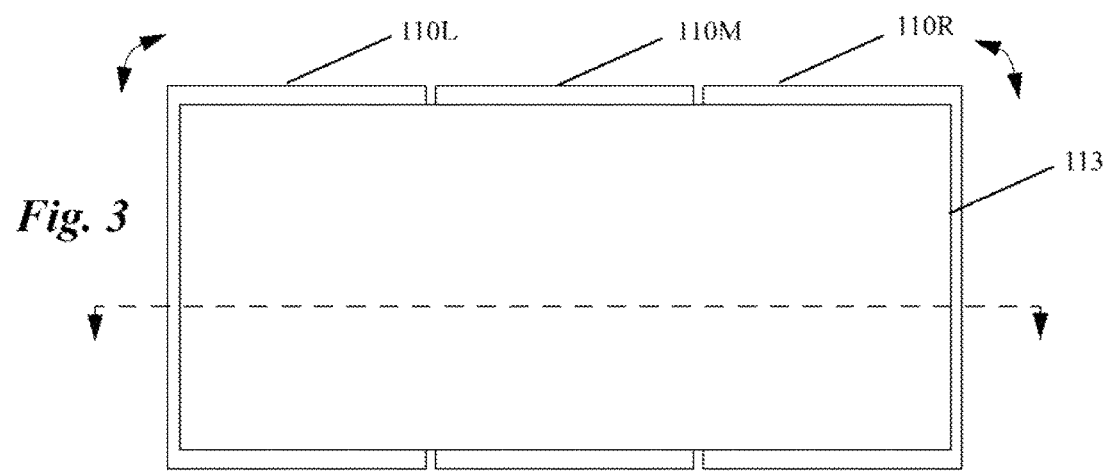
FIG. 3 is a front view of another mobile electronic device having a display that allows for effective display size variation.
Figure 4:
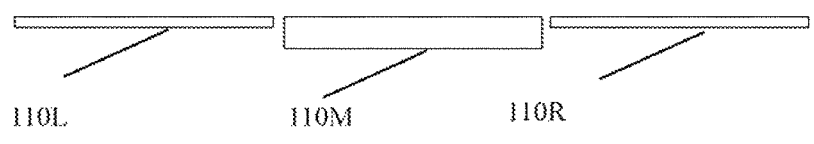
FIG. 4 is a sectional view of the mobile electronic device of FIG. 3.
Figure 5:
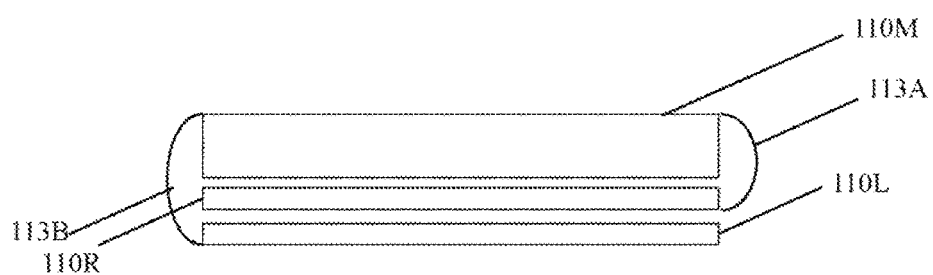
FIG. 5 is an end view of the mobile electronic device of FIG. 3 in one configuration thereof.
Figure 6:
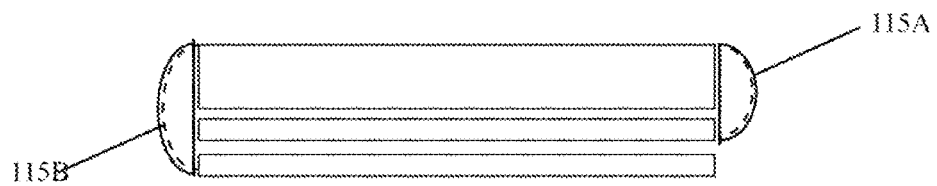
FIG. 6 is an end view of a variation of the mobile electronic device of FIG. 5.

A mobile electronic device having a different display configuration is shown in FIG. 3 and FIG. 4. In some embodiments, this display configuration may be provided also in the form of a display module. The mobile electronic device includes a middle portion 110M and hinged right and left portions 110R and 110L. A display screen 113 extends across all three portions 110M, 11OR and 110L Referring to FIG. 5, a cross-sectional view is shown of the mobile electronic device with the right and left portions folded back. The device is configured such that display folds 113A and 113B place minimal stress on the display. In an exemplary embodiment, edges of the display folds 113A and 113B are bare, i.e., uncovered. Protection for these edges may be provided by hinge members 115A and 115B as shown in FIG. 6. The hinge members adjoin the display fold edges and extend slightly beyond those edges to prevent those edges from being caught, bumped or damaged.

Referring to FIG. 7, a horizontal cross-section is shown of a mobile electronic device in accordance with one embodiment. A main body 102 of the device houses device electronics. The device is provided with a foldable display (104A, 104B) that is wider than a width of the mobile electronic device. A first portion of the display 104A may be integrated with the mobile electronic device. A second portion 104B of the display extends beyond the mobile electronic device and is supported by a backing member 106 and a folding mechanism 108. The backing member may be of a plastic or elastomer. In some embodiments, it is arranged to provide some measure of shock absorption in the event that the device is dropped in an unfolded configuration.

Figure 15:
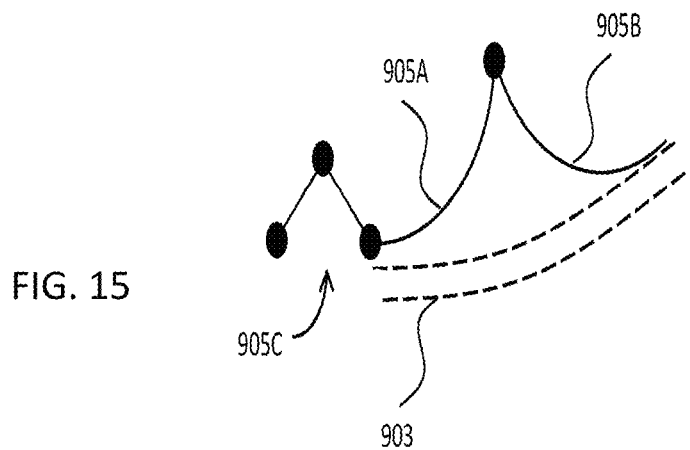
FIG. 15 is a diagram showing details of a folding mechanism.

Referring to FIGS. 8 and 9, the folding mechanism 108 is arranged to allow the second portion of the display 104B to be folded around and behind the main body 102. The folding mechanism may be arranged to, when the display is fully folded back, form a half-cylinder. A transition portion of the display folds around the half-cylinder. Details of the folding mechanism are shown in FIG. 15 and described hereinafter. The display may be arranged so that a slight gap remains between the display and the half-cylinders in the folded position, so as to avoid any deformation of the display. When the device is not being carried, it may rest in the unfolded position, again to relieve stress on the display.

Referring to FIGS. 10, 11 and 12, the display (403, 403A, 403B) may be extended at both sides of the main body 401 in similar manner as in FIGS. 7, 8 and 9, using two folding mechanisms 405A and 40513. In the illustrated embodiment, when both the extended portions of the display are folded back, the right-hand extension of the display 403A is folded back first, followed by the left-hand extension of the display 403B. In other embodiments, the order in which the display extensions are folded back may be reversed or may not matter.

The folding mechanism may be arranged such that, in a closed condition, the half cylinder is closed at the top and at the bottom.

Figure 13:
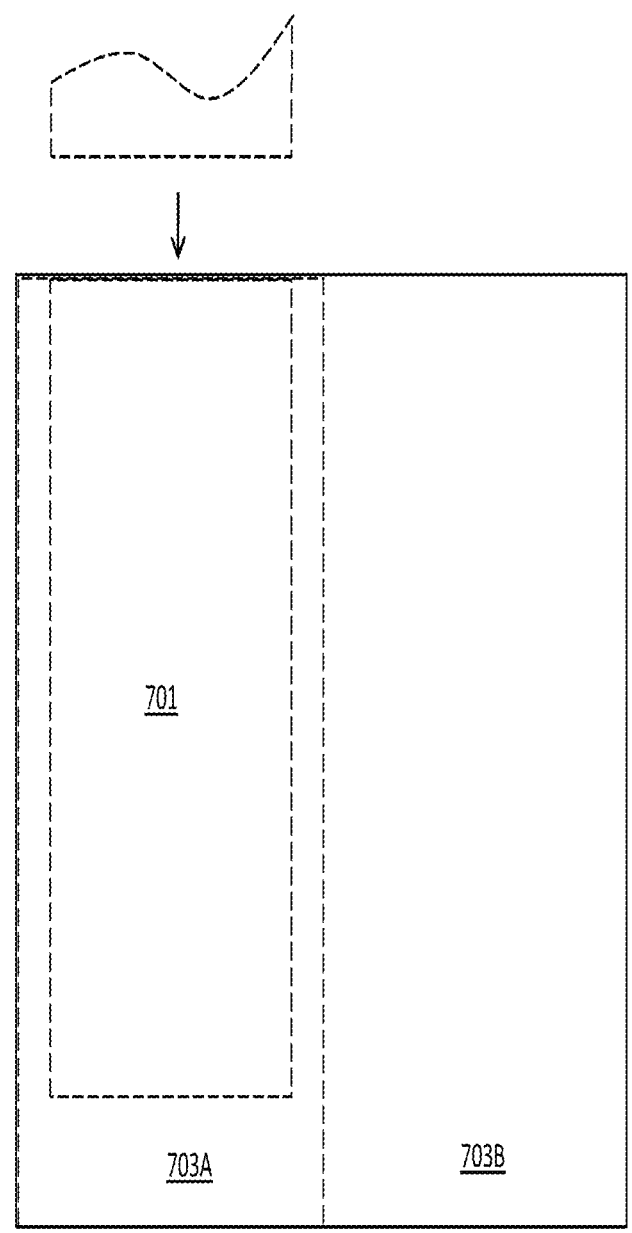
FIG. 13 is a diagram of a display accessory device.
Figure 14:
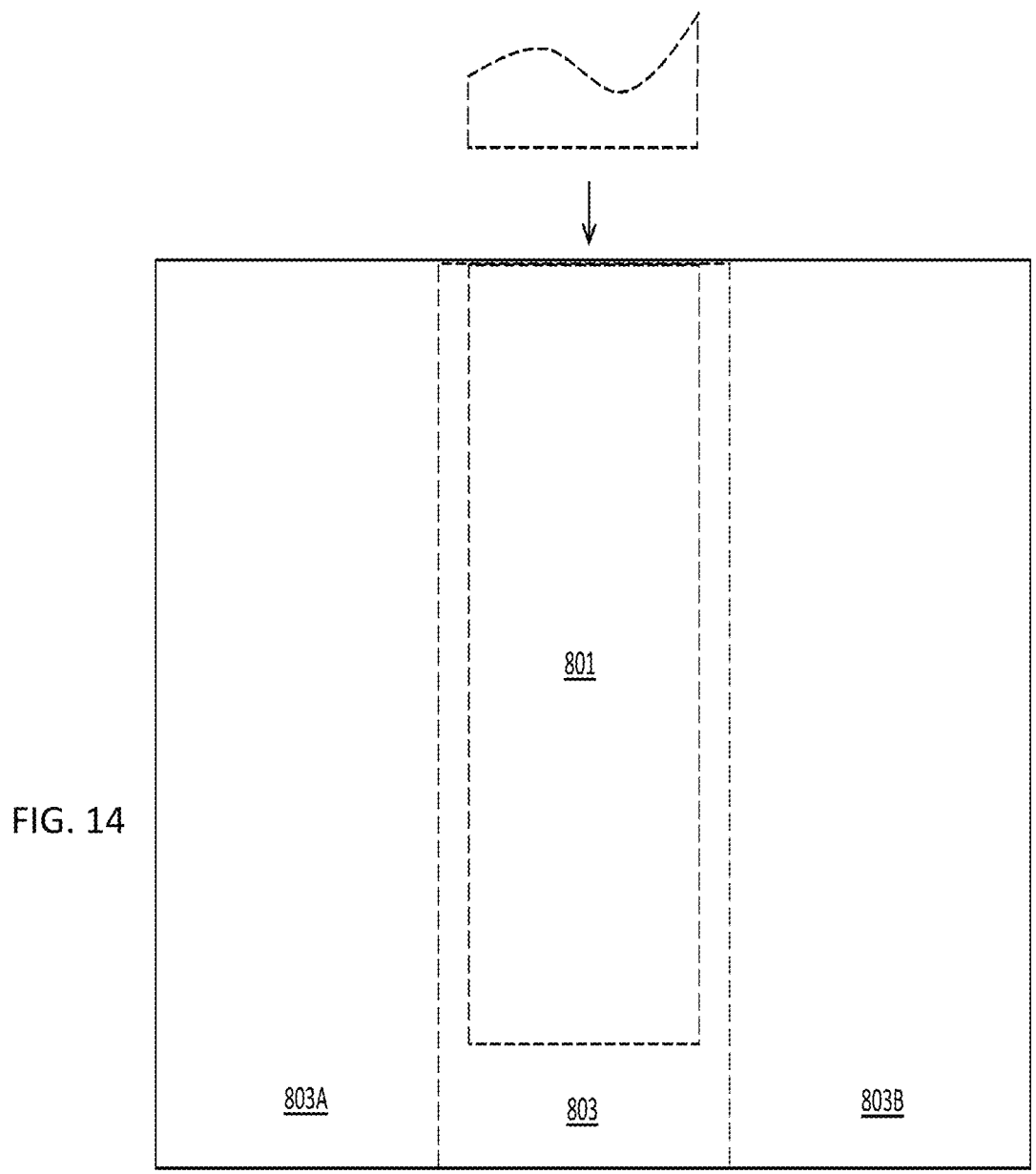
FIG. 14 is a diagram of another display accessory device.

Referring to FIGS. 13 and 14, display accessory devices are shown. The accessory devices are arranged to receive a mobile electronic device within a docking cavity (701, 801) of a main body of the device. The accessory devices are each provided with a foldable display (703A, 703B; 803, 803A, 803B), one or more backing members (not shown), and one or more folding mechanisms (not shown). With mobile electronic device inserted, the display accessory device of FIG. 13 corresponds generally to the device of FIGS. 7, 8 and 9. Similarly, with mobile electronic device inserted, the display accessory device of FIG. 14 corresponds generally to the device of FIGS. 10, 11 and 12. The main body of the accessory devices may include electronics, including display interface electronics, as needed.

In some embodiments, the display may be stacked together with a thin, flat foldable battery.

In some embodiments, a user interface may use both front-facing and rear-facing portions of the display, in a folded condition. In other embodiments, the display may be customized so that only a front-facing portion of the display is powered and the remainder of the display is unpowered.

Referring to FIG. 15, an enlarged view is shown of a folding mechanism 900 in accordance with one embodiment. A jointed extension member 905C adjoins two quarter-cylinder members 905A, 905B that are joined together. The various members are provided with detents as needed to hold the fully-closed and fully-open positions.

A portion of the display 903 is shown in dashed line. The folding mechanism is shown in an intermediate position in-between the folded position and the unfolded position. As seen in FIGS. 7, 8 and 9, in the folded position, the extension member 905C is folded and rests flat against the device with no extension. In the unfolded position, the extension member 905C is fully extended away from the device. In the folded position, the quarter cylinders 905A, 905B adjoin one another to form a half-cylinder. In the unfolded position, the quarter cylinders 905A, 905B form a surface with a cusp-shaped concavity. If desired, measures may be taken to conceal the cusp-shaped concavity at the top and bottom of the display and/or to provide additional support to the display in this region. Similar measures may be taken with respect to the transition region of the display that is not permanently supported by a backing member.

In the illustrated embodiment, the extension portion 905C is needed in that the circumference of the half cylinder is greater than the sum of the projections of the quarter cylinders within the plane of the display in the unfolded position. Hence, without the extension portion, the display would not lie flat in the unfolded position.

It will be appreciated by those skilled in the art that the present invention may be embodied in other specific forms without departing from the spirit or essential character thereof. The disclosed embodiments are therefore intended in all respects to be illustrative and not restrictive. The scope of the invention is indicated by the appended claims rather than the foregoing description, and all changes that come within the scope and range of equivalents thereof are intended to be embraced therein.

What is claimed is:

1. A mobile electronic device comprising: a folding display having a viewing surface and an opposite non-viewing surface; a hinge coupled to the folding display and defining an axis of rotation; a semi-cylindrical backing member coupled to the hinge; and an assembly coupled to the hinge and configured to, during unfolding of the folding display, cause transverse motion of the axis of rotation away from a main body of the mobile electronic device, wherein the assembly comprises a screen support that directly contacts and supports the folding display and rotates about the axis of rotation; wherein the folding display, the hinge and the assembly are configured such that the display folds outwardly, such that in a folded state, one portion of the non-viewing surface of the folding display faces another portion of the non-viewing surface of the folding display;

and wherein, during the folded state, the semi-cylindrical backing member provides backing to the folding display in an area of the hinge.

\* \* \* \* \*